United States Patent
Ong Wai Lian et al.

(10) Patent No.: US 9,087,827 B2
(45) Date of Patent: Jul. 21, 2015

(54) MIXED WIRE SEMICONDUCTOR LEAD FRAME PACKAGE

(75) Inventors: Jenny Ong Wai Lian, Singapore (SG); Chen Wei Adrian Chng, Victoria (AU)

(73) Assignee: Infineon Technologies AG, Neubiberg (DE)

( * ) Notice: Subject to any disclaimer, the term of this patent is extended or adjusted under 35 U.S.C. 154(b) by 463 days.

(21) Appl. No.: 13/333,086

(22) Filed: Dec. 21, 2011

(65) Prior Publication Data

US 2012/0091568 A1    Apr. 19, 2012

Related U.S. Application Data

(62) Division of application No. 11/660,854, filed as application No. PCT/IB2004/002696 on Aug. 19, 2004, now Pat. No. 8,105,932.

(51) Int. Cl.
*H01L 23/00* (2006.01)
*H01L 23/495* (2006.01)
*H01L 23/31* (2006.01)

(52) U.S. Cl.
CPC ............ *H01L 23/4952* (2013.01); *H01L 24/48* (2013.01); *H01L 24/49* (2013.01); *H01L 24/78* (2013.01); *H01L 24/85* (2013.01); *H01L 23/3107* (2013.01); *H01L 23/49575* (2013.01); *H01L 24/45* (2013.01); *H01L 2224/05552* (2013.01); *H01L 2224/05553* (2013.01); *H01L 2224/05554* (2013.01);
(Continued)

(58) Field of Classification Search
CPC ........... H01L 2224/48465; H01L 2224/48247; H01L 2224/73265; H01L 2224/45144; H01L 2224/45124; H01L 2224/48463; H01L 2224/05644; H01L 2224/48475; H01L 2224/48699; H01L 24/15
USPC .............. 257/784, E23.025, E23.02, E23.033
See application file for complete search history.

(56) References Cited

U.S. PATENT DOCUMENTS 5,165,590 A * 11/1992 Cini et al. ..................... 228/175
5,291,061 A *  3/1994 Ball .............................. 257/686
(Continued)

FOREIGN PATENT DOCUMENTS

| DE | 19828190 | 9/1999 |
|----|----------|--------|
| EP | 0964446  | 12/1999 |
| JP | 58171838 | 10/1983 |

OTHER PUBLICATIONS

Office Action dated Mar. 16, 2010 in U.S. Appl. No. 11/660,854.
(Continued)

*Primary Examiner* — Davienne Monbleau
*Assistant Examiner* — Leslie Pilar Cruz
(74) *Attorney, Agent, or Firm* — Dicke, Billig & Czaja, PLLC

(57) ABSTRACT

One embodiment includes an encapsulated semiconductor package having a lead frame with die pad surrounded by a plurality of first and second leadfingers. A semiconductor chip including chip contact pads on its upper active surface is attached to the die pad. A plurality of first bond wires, incoluding a first electrically conductive material, extend between the chip contact pads and the plurality of first leadfingers. A plurality of second bond wires, including a second electrically conductive material, extend between a chip contact pad and a second leadfinger. The semiconductor package further includes a plurality of electrically conducting means attached to the second leadfingers.

21 Claims, 6 Drawing Sheets

(52) U.S. Cl.
CPC ............ *H01L 2224/05555* (2013.01); *H01L 2224/32245* (2013.01); *H01L 2224/45124* (2013.01); *H01L 2224/45144* (2013.01); *H01L 2224/4848* (2013.01); *H01L 2224/48091* (2013.01); *H01L 2224/48137* (2013.01); *H01L 2224/48227* (2013.01); *H01L 2224/48237* (2013.01); *H01L 2224/48247* (2013.01); *H01L 2224/48458* (2013.01); *H01L 2224/48463* (2013.01); *H01L 2224/48464* (2013.01); *H01L 2224/48465* (2013.01); *H01L 2224/48472* (2013.01); *H01L 2224/48475* (2013.01); *H01L 2224/48479* (2013.01); *H01L 2224/48491* (2013.01); *H01L 2224/48499* (2013.01); *H01L 2224/48599* (2013.01); *H01L 2224/48699* (2013.01); *H01L 2224/4903* (2013.01); *H01L 2224/4945* (2013.01); *H01L 2224/49051* (2013.01); *H01L 2224/73265* (2013.01); *H01L 2224/78313* (2013.01); *H01L 2224/78318* (2013.01); *H01L 2224/85051* (2013.01); *H01L 2224/85191* (2013.01); *H01L 2224/85439* (2013.01); *H01L 2924/01013* (2013.01); *H01L 2924/01015* (2013.01); *H01L 2924/01028* (2013.01); *H01L 2924/01029* (2013.01); *H01L 2924/01047* (2013.01); *H01L 2924/01078* (2013.01); *H01L 2924/01079* (2013.01); *H01L 2924/01082* (2013.01); *H01L 2924/01322* (2013.01); *H01L 2924/14* (2013.01); *H01L 2924/15747* (2013.01)

(56) References Cited

U.S. PATENT DOCUMENTS

| | | | | |
|---|---|---|---|---|
| 5,994,212 | A | * | 11/1999 | Arakawa et al. ............. 438/617 |
| 6,500,760 | B1 | | 12/2002 | Peterson et al. |
| 2001/0045627 | A1 | | 11/2001 | Connah et al. |
| 2002/0070434 | A1 | | 6/2002 | Abbott et al. |
| 2002/0084516 | A1 | | 7/2002 | Efland et al. |
| 2002/0084518 | A1 | * | 7/2002 | Hasebe et al. ............... 257/676 |
| 2002/0093096 | A1 | | 7/2002 | Tago et al. |
| 2002/0171155 | A1 | * | 11/2002 | Fujihira ....................... 257/780 |
| 2003/0057113 | A1 | * | 3/2003 | Kitamura et al. ............ 206/204 |

OTHER PUBLICATIONS

Office Action dated Dec. 22, 2010 in U.S. Appl. No. 11/660,854.

* cited by examiner

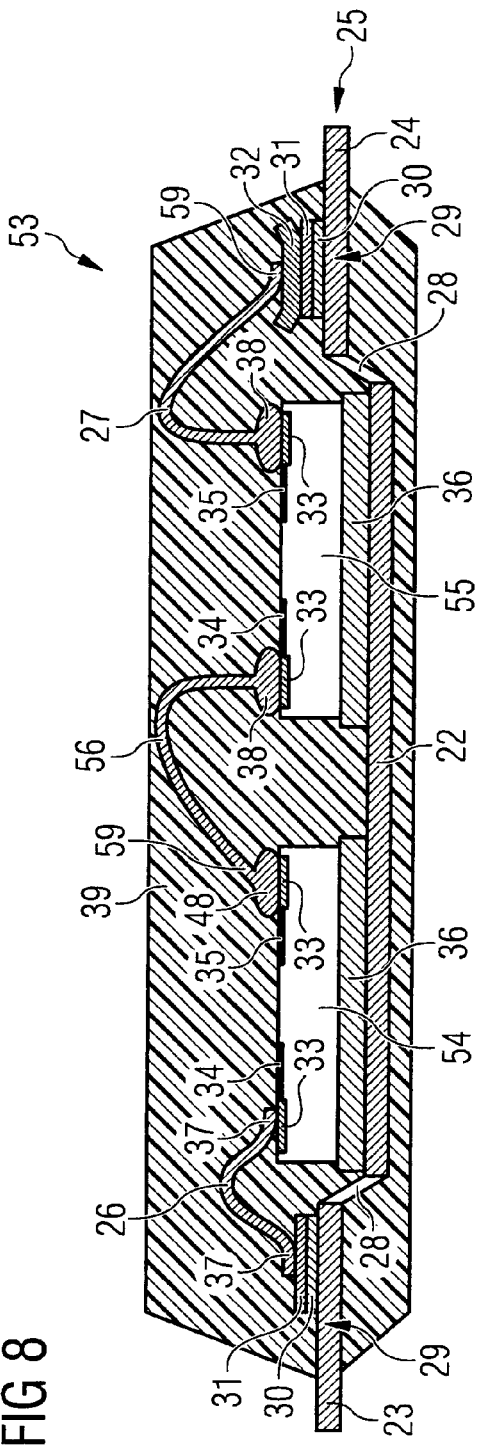
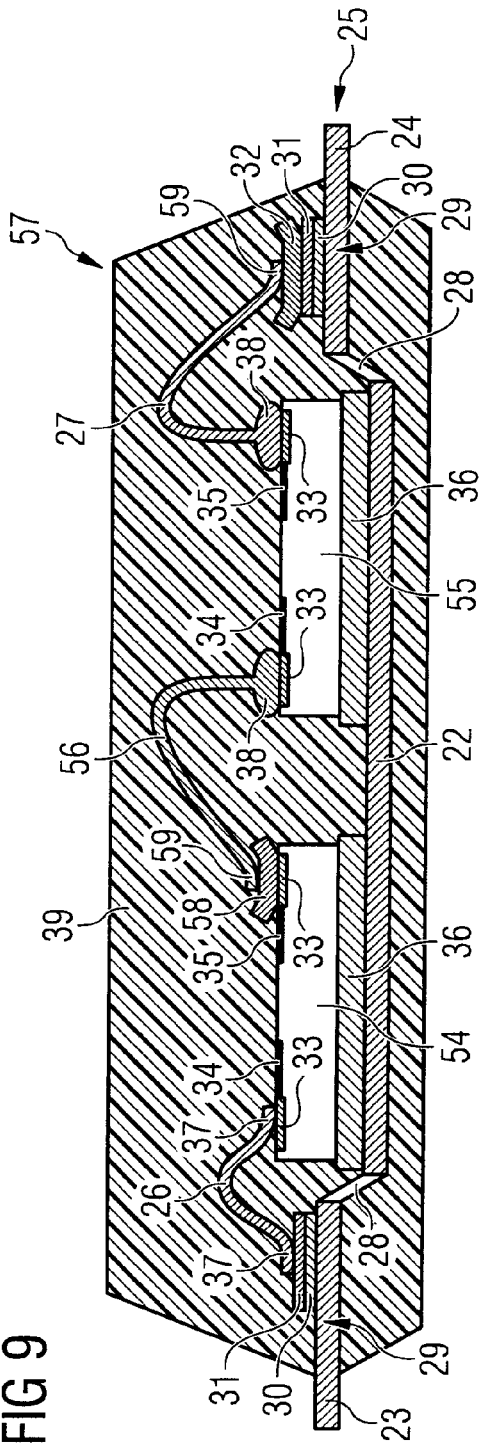

MIXED WIRE SEMICONDUCTOR LEAD FRAME PACKAGE

CROSS REFERENCE TO RELATED APPLICATION

This Utility Patent Application is a divisional application of U.S. application Ser. No. 11/660,854, filed Jun. 4, 2008, and claims the benefit of the filing date of International Application No. PCT/IB2004/002696, filed Aug. 19, 2004, which are both incorporated herein by reference.

BACKGROUND

One aspect of the invention relates to an improved mixed wire semiconductor lead frame package and a method for producing the package.

Mixed wire semiconductor lead frame packages which include two pluralities of bond wires, each including a different metal, are known. A package 1 of the prior art is illustrated in FIG. 1. The package 1 includes a copper lead frame 2 with a recessed die pad 3 laterally surrounded by a plurality of leadfingers 4 and a semiconductor chip 5 which is mounted to the die pad 3 with die attach material 6. The semiconductor chip 5 includes integrated circuit devices 7 on its upper active surface and a plurality of chip contact pads 8. Some devices are electrically connected to the lead frame 2 by aluminium bond wires 9 and other devices by gold bond wires 10.

Aluminium bond wires 9 of a large diameter are commonly used to electrically connect power devices to the lead frame 2 since a high current capacity is desired. A wedge-bonding technique is commonly used for the aluminium bond wires 9 and a large laterally rectangular bond pad is provided on the chip 5 which increases the chip dimensions. The chip contact pads of devices which require a smaller current capacity are connected to the lead frame by gold wires 10 which typically have a smaller diameter than the aluminium bond wires 9. The gold wires 10 are bonded using a ball bonding technique. Smaller laterally square contact pads are provided on the semiconductor chip 5 for the gold ball bonds.

The aluminium bond wires 9 and gold bond wires 10 are bonded to landing pads 11, 12, respectively, provided on the inner portion of the leadfingers 4. Since a silver-aluminium interface is known to be unreliable, landing pads 11, 12 including two different materials are provided. The landing pads 11 include NiNiP for the aluminium bond wires 9, whereas the landing pads 12 for the gold bond wires 10 include silver, in order that the bond wires 9, 10 form a bond and, therefore, a good electrical connection with the landing pads 11, 12 respectively.

Therefore, in order to manufacture the lead frame 2, which is suitable for the mixed wire semiconductor package 1, the lead frame 2 undergoes two precision electro-plating process steps; one in which the NiNiP landing pads 11 are electroplated and one in which the silver landing pads 12 are electroplated.

The requirement of two precision electroplating process steps leads to high production costs for mixed wire semiconductor packages and the potential risk of cross contamination of the lead frame during the eletroplating of the different metals.

SUMMARY

One embodiment of the invention provides an improved mixed wire semiconductor package and a simplified manufacturing process in which the disadvantages associated with multiple precision electroplating process steps are avoided.

One embodiment of the invention provides an improved mixed wire multi-chip semiconductor package.

A semiconductor package according to one embodiment of the invention includes a lead frame with a die pad, a plurality of first leadfingers and a plurality of second leadfingers. Each of the first and second leadfingers includes a landing pad positioned on its inner portion towards the inner end of the leadfinger.

One embodiment of the semiconductor package also includes a semiconductor chip including a plurality of integrated circuit devices and a plurality of chip contact pads on its upper active surface. The semiconductor chip is attached to the die pad by its rear passive surface by conventional die attach material, as is well known in the art.

One embodiment of the semiconductor package further includes a plurality of first bond wires including a first electrically conductive material. Each first bond wire extends between a chip contact pad and a landing pad positioned on the plurality of first leadfingers.

A plurality of second bond wires, which includes a second electrically conductive material, is also provided in the semiconductor package according to one embodiment of the invention. Each second bond wire extends between a chip contact pad and a second leadfinger.

In one embodiment, a plastic mould mass encapsulates the semiconductor chip, the pluralities of first and second bond wires and inner portions of the pluralities of first leadfingers and second leadfingers to form an encapsulated mixed wire semiconductor lead frame package.

The semiconductor package according to one embodiment of the invention includes a plurality of first electrically conducting means. A first electrically conducting means is attached to the landing pad of each of the plurality of second leadfingers and a second bond wire extends between, and is attached to, a chip contact pad and a first electrically conducting means.

One embodiment of the invention further provides a semiconductor package which includes at least two semiconductor chips. Such packages are commonly referred to as multi-chip semiconductor packages or multi-chip modules. The multi-chip module according to one embodiment of the invention includes a lead frame having at least a die pad, a plurality of first leadfingers and a plurality of second leadfingers, each including a landing pad on its inner portion.

The multi-chip module further includes at least two semiconductor chips including integrated circuits and chip contact pads on their upper active surfaces. The semiconductor chips are attached to the die pad by their rear passive surfaces.

A plurality of first bond wires including a first electrically conductive material is provided, each extending between a chip contact pad and a landing pad of the plurality of first leadfingers. A plurality of second bond wires including a second electrically conductive material is provided, each extending between a chip contact pad and a second leadfinger. A plurality of third bond wires including a third electrically conductive material extending between the semiconductor chips.

A plastic mould mass encapsulates the semiconductor chips, the pluralities of first, second and third bond wires and inner portions of the pluralities of first leadfingers and second leadfingers.

The multi-chip module further includes a plurality of first electrically conducting means. A first electrically conducting means is attached to the landing pad of each of the plurality of second leadfingers, and a second bond wire is attached to the first electrically conducting means.

In contrast to the mixed wire packages known in the art, the mixed wire semiconductor packages according to the invention, therefore, include landing pads, which inlcude essentially the same material and which are deposited in the same step of the manufacturing process, on both the pluralities of first and second leadfingers. Therefore, multiple precision or selective electro-plating or electro-deposition steps are avoided.

The semiconductor packages of the invention, for example, includes a lead frame with a recessed die pad and, in one example, at least one die pad lead.

In one example, the plurality of first electrically conductive means includes a plurality of electrically conductive bumps or electrically conductive wedges or electrically conductive balls. The first electrically conductive means are formed using a ball-bonding or a wedge-bonding technique. Since these techniques are used for forming bond connections between the chip and lead frame in the package, the additional complexity and cost of providing new equipment is, therefore, avoided.

The plurality of first electrically conducting means in one example, has an approximately rectangular longitudinal cross-section and is positioned on the landing pad of the second leadfinger with its long side of approximately parallel to the length of the second leadfinger or approximately orthogonal to the length of the second leadfinger. In one example, a first electrical conducting means positioned approximately orthogonal to the length of the second leadfinger is advantageous if two or more wires are to be bonded to a landing pad of a second leadfinger. Alternatively, the first electrically conductive means can have any lateral orientation with respect to the length of the second leadfinger.

In one example, the plurality of first bond wires is attached to the landing pads of the first leadfingers with a ball-bond, bump or a wedge-bond and the plurality of second bond wires is attached to the first electrically conducting means on the second leadfingers with a ball-bond, a bump, a wedge-bond or a stitch-bond.

The reliability of the bond connection is improved if the interfacial area between the bond wire and the first electrically conductive means is increased. If, for example, the first electrically conductive means has an approximately rectangular longitudinal cross-section, for example, it is a wedge, its lateral orientation on the landing pad of the second leadfinger is chosen to increase the interfacial area by laterally orientating the conductive means and bond wire in approximately the same orientation. Alternatively, if the second bond wire is attached by a wedge-bond to the electrically conductive means which itself has an approximately rectangular longitudinally orientated wedge form, then a bond between the wire and first electrically conductive means can be more reliably formed, as the relative positioning is more flexible, if they are mutually approximately orthogonally orientated.

However, if, for example, the second bond wire is bonded to the first electrically conductive means using a ball-bond and therefore has a symmetrical and approximately circular lateral bond surface and the first electrically conductive means has an approximately rectangular longitudinal cross-section, then the interfacial area between the bond wire and first electrically conductive means is essentially the same for all lateral orientations of the first electrically conductive means. Therefore, the first electrically conductive means can be orientated on the landing pad so as to the advantage of the manufacturing process, for example by minimising the movement of the bonding tool.

The first electrically conductive means may have a variety of orientations or forms on a lead frame of a single package. This enables an increased flexibility for the bonding process.

In one example, the plurality of second bond wires and plurality of electrically conducting means include a different material. The plurality of first bond wires and the plurality of electrically conducting means in one example include essentially the same material. This enables the first bond wires and first electrically conductive means to be formed in the same manufacturing process step, thus simplifying the manufacturing process and saving time and costs.

In one example, under typical wire-bonding conditions, the material of the first bond wire and the material of the landing pad form a eutectic, the material of the electrically conducting means and the material of the landing pad form a eutectic, the material of the second bond wire and the material of the landing pad form no eutectic, and the material of the second bond wire and the material of the electrically conducting means form a eutectic. Typical conditions used to form a bond between the bond wires and the landing pads which include various materials in, for example, ball-bonding, wedge-bonding and stitch-bonding techniques are known in the art.

The formation of a eutectic between two metals or metal alloys is well known. Under certain conditions, for example temperature and pressure, a eutectic mixture of the two metals is formed. The eutectic mixture has a lower melting point than that of each of the pure metals. This effect is used in the bonding process to form a melt at the interface between the bond wire and landing pad providing a good electrical and mechanical bond between the wire and landing pad without melting the body of the bond wire or landing pad.

Since the material of the second bond wire and the material of the landing pad form no eutectic under typical wire bonding conditions, a good electrical and mechanical bond is not formed. Therefore, a first electrically conductive means including a material which forms a eutectic with the material of the landing pad and a eutectic with the material of the second bond wire is placed between the second bond wire and the landing pad. A good electrical and mechanical bond is, therefore, formed between the first electrically conductive means and the landing pad and between the second bond wire and the first electrically conductive means. Since the material of the first bond wire and the material of the landing pad form a eutectic a good electrical and mechanical bond is formed and a first electrically conductive means is not included.

The first electrically conductive means has the function of an intermediate or a buffer material which enables the landing pads of the first and second leadfingers to include essentially the same material. The landing pads for both the first and second bond wires are deposited in a single electroplating step in the production process, thus providing a simpler process and saving time and costs.

Since the first electrically conductive means in one example include a ball-bond or a wedge bond, they are formed in the same stage of the process as the bond wire connections. If the first electrically conductive means and the first bond wire means include essentially the same material and the same type of bond, for example a wedge bond, then they can be formed in the same manufacturing process step. This avoids a third bonding tool and a third material as well as saving production time, material. Production costs and, ultimately, the cost of the semiconductor package are reduced.

In one example, the lead frame includes copper or a copper alloy, the landing pads include a layer of nickel positioned on the surface of the first and second leadfingers and a layer of nickel phosphorous positioned on the layer of nickel, the plurality of first bond wires and the electrically conducting means include aluminium or an aluminium alloy and the plurality of second bond wires include gold or a gold alloy.

In this case, the aluminium or aluminium alloy of the first bond wires and first electrically conductive means forms a eutectic with the NiNiP landing pad under typical bonding conditions and the gold or gold alloy of the second bond wires forms a eutectic with the aluminium conductive means. Gold and gold alloys form no eutectic with NiNiP under typical bonding conditions.

The lead frame includes copper or a copper alloy, the landing pads include a silver layer positioned on the surface of the first and second leadfingers, the plurality of first bond wires and the electrically conducting means include gold or a gold alloy and the plurality of second bond wires include aluminium or an aluminium alloy.

A lead frame of copper or a copper alloy has the advantage that the production methods are well-known, the material is available in high purity and is relatively inexpensive. Ni, NiNiP and silver landing pads are also well-known and selective electro-deposition techniques are reliable.

The semiconductor package including one or at least two semiconductor chips in one example, includes at least one second electrically conducting means attached to at least one chip contact pad. The second electrically conductive means, in one example, includes electrically conductive bumps, electrically conductive wedges or electrically conductive balls. The second electrically conductive means is, in one example, positioned between, and electrically connected to, the chip contact pad and a bond wire.

The second electrically conducting means has an approximately rectangular longitudinal cross-section and is positioned on the chip pad with its long side of approximately parallel to the length of the chip pad. Alternatively, the second electrically conducting means has an approximately rectangular longitudinal cross-section and is positioned on the chip pad with its long side of approximately orthogonal to the length of the chip pad. Alternatively, the second electrically conductive means is orientated on the chip pad with any lateral orientation. This has the advantage that the interfacial area between the bond wire and the second electrically conductive means can be increased.

In one example, the second electrically conductive means includes essentially the same material as the first conductive means. This allows the first and second conductive means to be formed in the same step of the manufacturing process and reduces manufacturing time and costs.

The semiconductor package according to the invention, in one example, further includes a plurality of grounding pads positioned on the die pad. This enables the chip to be grounded to the lead frame of the semiconductor package. A plurality of grounding electrically conducting means is, in one example, positioned on the grounding pads and a grounding wire extending between a chip contact pad and the grounding electrically conductive means electrically connects the chip with the lead frame.

The provision of the grounding electrically conductive means on the grounding pad enables the grounding pad to include essentially the same material as that of the landing pads so that both the landing pads and grounding pads can be deposited at the same time. This avoids further electro-plating steps, simplifying the fabrication of the semiconductor package and reducing costs.

The plurality of grounding electrically conductive means, in one example, includes a plurality of electrically conductive bumps or electrically conductive wedges or electrically conductive balls. This enables the grounding electrically conductive means to be formed during the same stage of the manufacturing process as the first electrically conductive means which are positioned on the landing pads.

The plurality of grounding bond wires is attached to the grounding electrically conducting means on the die pad with a ball-bond, a bump or a stitch bond, the most appropriate bond type is provided so that, for example, the bond type is compatible with the material of the wire.

In one example, under wire-bonding conditions the material of the first bond wire and the material of the landing pad form a eutectic, the material of the first electrically conducting means forms a eutectic with the material of the landing pad, the material of the second bond wire and the material of the landing pad form no eutectic, the material of the second bond wire and the material of the first electrically conducting means form a eutectic, the material of the grounding electrically conductive means and the material of the grounding pad form a eutectic, and the material of the grounding wire and the material of the grounding electrically conductive means form a eutectic.

Therefore, a good and reliable bond is formed between the first bond wire and the landing pad, the second bond wire and the first electrically conductive means and the first electrically conductive means the landing pad. A good bond is also formed between the grounding wire and the grounding electrically conductive means and the grounding electrically conductive means and the grounding pad. A reliable grounding of the chip to the lead frame is, therefore, provided.

The lead frame, in one example, includes copper, and similarly to the landing pads, the grounding pads include a layer of nickel positioned on the surface of the die pad of the lead frame and a layer of nickel phosphorous positioned on the layer of nickel. In one example, the plurality of first bond wires, the electrically conducting means and the grounding electrically conductive means include aluminium or an aluminium alloy and the plurality of second bond wires and the plurality of grounding wires include gold or a gold alloy.

This allows the grounding pads to be formed in the same electro-plating steps as the landing pads and therefore further processing steps are not introduced into the manufacturing line reducing the production costs. Also, since the grounding and first electrically conductive means include essentially the same material, the first and grounding electrically conductive means may be fabricated in the same process step. Since the second and grounding bond wires include the same material, the second and grounding bond wires can be provided in the same process step.

The manufacture of the package is, therefore, simplified and costs reduced as the number of different materials used in the package is not increased.

In the multi-chip module according to the invention, the plurality of third bond wires, in one example, include essentially the same material as the plurality of second bond wires or the plurality of first bond wires. The plurality of third bond wires is, in one example, attached to the chip pads of the first and second semiconductor chips with a ball bond, a bump or a wedge bond. Alternatively, the plurality of third bond wires is attached to the second electrically conductive means positioned on the chip pads with a ball bond, a bump or a wedge bond.

A first semiconductor chip of the multi-chip module is, in one example electrically connected by first bond wires to the plurality of first leadfingers. A second semiconductor chip is, in one example, electrically connected by second bond wires to the plurality of second leadfingers. This arrangement is advantageous as the most appropriate type of bond wire can be chosen for the integrated circuits of each type of semiconductor chip.

The multi-chip module, in one example, includes at least one logic semiconductor chip and at least one power semiconductor chip. More in one example, the multi-chip module includes at least one power chip electrically connected to the first leadfingers of the lead frame by a plurality of first bond wires and at least one logic chip electrically connected to the first electrical means of the second leadfingers of the lead frame by a plurality of second bond wires.

In one example, in the multi-chip module according to one embodiment of the invention, the first bond wires include aluminium or an aluminium alloy, the second bond wires include gold or a gold alloy, the first electrical means includes aluminium, the lead frame includes copper and the landing pads include Ni and NiP.

The bond wires connecting the logic chip to the second leadfingers, which in one case include first electrically conductive means, for example, include gold. The bond wires connecting the power chip to the first leadfingers of the lead frame and to the logic chip in one example include aluminium and, in one example, have a larger diameter than the gold bond wires. The larger diameter is advantageous for the supply of high currents.

The chip pads, in one example, have a rectangular form for the bond wires connected using a wedge bond and a square form for bond wires connected using a ball bond. A rectangular chip pad is advantageous for wedge bonds as the interface formed between the chip pad and the wedge bond is of a rectangular form.

One embodiment of the invention also provides methods to assemble semiconductor packages. One method includes the following steps.

Firstly, a lead frame including a die pad, a plurality of first leadfingers and a plurality of second leadfingers is provided. The lead frame is produced by etching or stamping methods known in the art. Initially, a lead frame strip including a plurality of lead frames is formed in which the plurality of lead frames are orientated in rows and columns forming an array. The individual lead frames are connected to the lead frame strip surround and to each other by tie bars which are removed at a later stage of the process to form individual lead frame packages.

A landing pad is then deposited on the inner portion of each first leadfinger and each second leadfinger. A semiconductor chip including a plurality of integrated circuit devices and a plurality of chip contact pads on its upper active surface is provided. The passive rear surface of the semiconductor chip is attached to the die pad using conventional die attach material.

A first electrically conducting means is then formed on each landing pad of the plurality of second leadfingers.

Bond connections are formed between the chip contact pads and landing pads of the plurality of first leadfingers with first bond wires. Bond connections are formed between the chip contact pads and first electrically conducting means of the plurality of second leadfingers with second bond wires.

The semiconductor chip, the first and second bond wires and inner ends of the pluralities of first and second leadfingers are then encapsulated in a plastic mould material.

A method according to one embodiment of the invention to assemble a semiconductor package including at least two semiconductor chips includes the following steps. A lead frame including a die pad, a plurality of first leadfingers and a plurality of second leadfingers is provided. A plurality of landing pads is deposited on the inner portion of the first leadfinger and second leadfingers and at least two semiconductor chips including integrated circuits and chip contact pads on the upper active surface are attached by the passive rear surface to the die pad.

A plurality of first electrically conducting means is formed on the landing pads of each of the plurality of second leadfingers.

First bond connections are then formed between the chip contact pads and landing pads of the plurality of first leadfingers with first bond wires. Second bond connections are formed between the chip contact pads and electrically conducting means of the plurality of second leadfingers with second bond wires. Third bond connections are formed between the semiconductor chips with third bond wires.

The semiconductor chips, the pluralities of first second and third bond wires and inner ends of leadfingers are encapsulated in a plastic mould material.

In one example, the lead frame includes a recessed die pad and at least one die pad lead. A recessed die pad is typically formed by a pressing technique.

In one example, the first electrically conducting means has an approximately rectangular longitudinal cross-section and is formed on the landing pad of the second leadfinger approximately parallel to the length of the second leadfinger or approximately orthogonal to the length of the second leadfinger. Alternatively, the first electrically conductive means laterally positioned with any lateral orientation with respect to the length of the second lead finger.

In one example, the first electrically conducting means is formed by a wedge-bonding technique or a ball bonding technique. These techniques are reliable well known and widely used. Therefore, start-up costs can be saved as the existing production line can be used.

In one example, the landing pads are formed by depositing a first layer on the surface of the leadfinger and by depositing a second layer on the first layer. This has the advantage of forming a reliable landing pad which forms a good bond with the material of the lead frame and with the first bond wire and electrically conductive means. In one example, the landing pads are deposited using a selective electro-deposition or electro-plating technique. Selective electro-plating techniques are well-known in the art.

Since the landing pads of both the first and second leadfingers are electro-plated at essentially the same time in a single process step, the manufacturing process is simplified and costs are saved. A further advantage of the method according to one embodiment of the invention is that since a conventional lead frame, i.e. all the landing pads include essentially the same material, is used, the same lead frame can be used for different semiconductor products and the flexibility of having various products in the internal configuration of the same package without changing the lead frame type is enabled.

In one example, the plurality of first bond wires is attached to the chip contact pads and the landing pads of the plurality of first leadfingers using a ball-bonding or a wedge-bonding technique and the plurality of second bond wires are attached to the chip contact pads and the first electrically conducting means of the plurality of second leadfingers using a ball-bonding or a wedge-bonding or a stitch-bonding technique. These techniques are well-known and reliable.

If the first bond wires and electrically conductive means include essentially the same material and are formed using the same technique, for example a wedge bonding technique, then they can be formed in the same process step. All of the electrically conductive means can be formed on the landing pads of the second leadfingers in a first stage followed by forming all of the bond connections between the chip contact pad and the landing pad of the first leadfingers by first bond wires or these steps can be reversed. Alternatively, the electrically conductive means and the first wire bonds can be made in a mixed way in the same process step. This has the advantage that the movement of the tool can be minimised and collisions between formed bonds and the movement of the tool can be avoided.

In one example, the lead frame includes copper or a copper alloy, the landing pads include a layer of nickel positioned on the surface of the first and second leadfingers and a layer of nickel phosphorous positioned on the layer of nickel, the plurality of first bond wires and the electrically conducting means include aluminium or an aluminium alloy and the plurality of second bond wires include gold or a gold alloy.

The gold wires are bonded by a ball bonding technique which uses temperature and pressure to form the bond and the aluminium wires are, more in one example, bonded using a wedge bonding technique which uses mainly ultrasonic energy and force to form the bond. Gold ball bonding is, in one example, used for bonding over active circuits and chips with delicate, such as low thermal expansion material, layers.

At least one second electrically conducting means is, in one example, attached to at least one chip contact pad. The plurality of second electrically conductive means is, in one example, formed by a ball-bonding or a wedge-bonding technique.

The second electrically conducting means has an approximately rectangular longitudinal cross-section and is formed on the chip pad with its long side of approximately parallel to the length of the chip pad. Alternatively, the second electrically conducting means has an approximately rectangular longitudinal cross-section and is positioned on the chip pad with its long side of approximately orthogonal to the length of the chip pad. The lateral orientation of the second electrically conducting means is, in one example, chosen so as to increase the interfacial area between the bond wire and the second electrically conductive means.

The second electrically conductive means is, in one example, electrically connected to the chip contact pad and a bond wire.

The method to assemble the package according to the invention further includes the steps of depositing at least one grounding pad on the die pad. A grounding electrically conductive means is then formed on the grounding pad and bond connections are formed between contact pads on the chip and the grounding electrically conductive means. This enables the chip to be grounded to the lead frame.

In one example, the grounding pads are formed by depositing a first layer on the surface of the die pad and by depositing a second layer on the first layer. The grounding pads are, in one example, deposited using a selective electro-deposition technique which is well-known in the art and inexpensive. More in one example, the grounding pads are formed in the same process steps as the landing pads. This further reduces the costs and complexity of the assembly process as only one masking step for the electro-plating process is required.

The plurality of grounding bond wires are, in one example, attached to the chip contact pads and the grounding electrically conductive means using a ball-bonding or a wedge-bonding or a stitch-bonding technique. These techniques are well known in the art and the most appropriate technique depends on a number of factors known in the art such as the material of the bond wire. The grounding wire is attached to the chip pad with a ball-bond and to the grounding electrically conductive means with a stitch-bond.

In the multi-chip module according to one embodiment of the invention, in one example, at least one power semiconductor chip and at least one logic semiconductor chip are attached to the die pad.

In one example, at least one power chip is electrically connected to the first leadfingers of the lead frame by a plurality of first bond wires and at least one logic chip is electrically connected to the first electrical means of the second leadfingers of the lead frame by a plurality of second bond wires.

The plurality of third bond wires is attached to the chip pads of the at least two semiconductor chips by a ball-bonding or a wedge-bonding or a stitch-bonding technique. Alternatively, the plurality of third bond wires is attached to the second electrically conductive means positioned on the chip pads by a ball-bonding or a wedge-bonding or a stitch-bonding technique, and in one example, by a stitch bond.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 8 illustrates a first multi-chip module according to one embodiment of the invention.

FIG. 9 illustrates a second multi-chip module according to one embodiment of the invention.

DETAILED DESCRIPTION

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
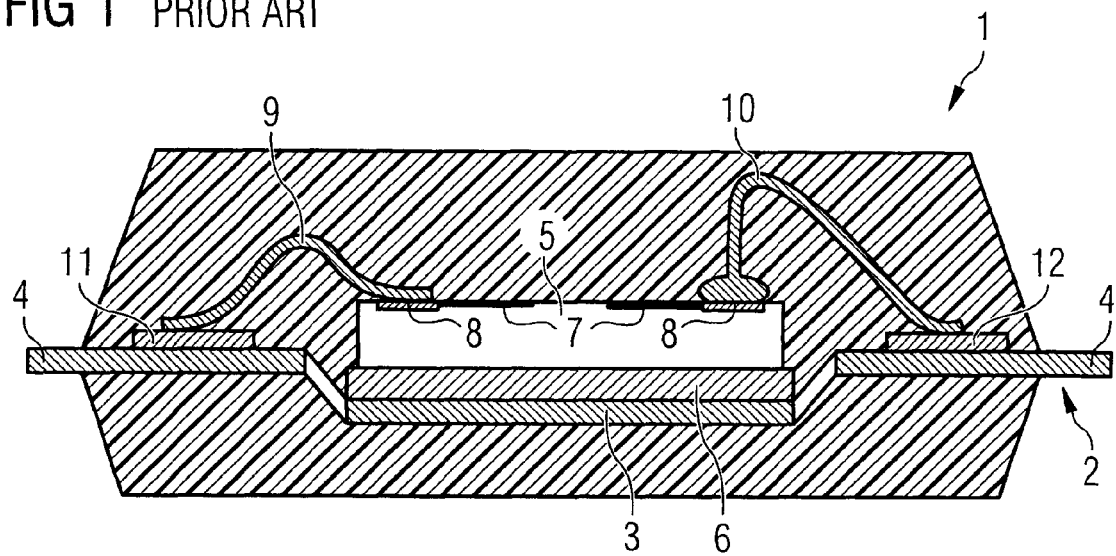
FIG. 1 illustrates an encapsulated mixed wire semiconductor lead frame package known in the prior art.
Figure 2:
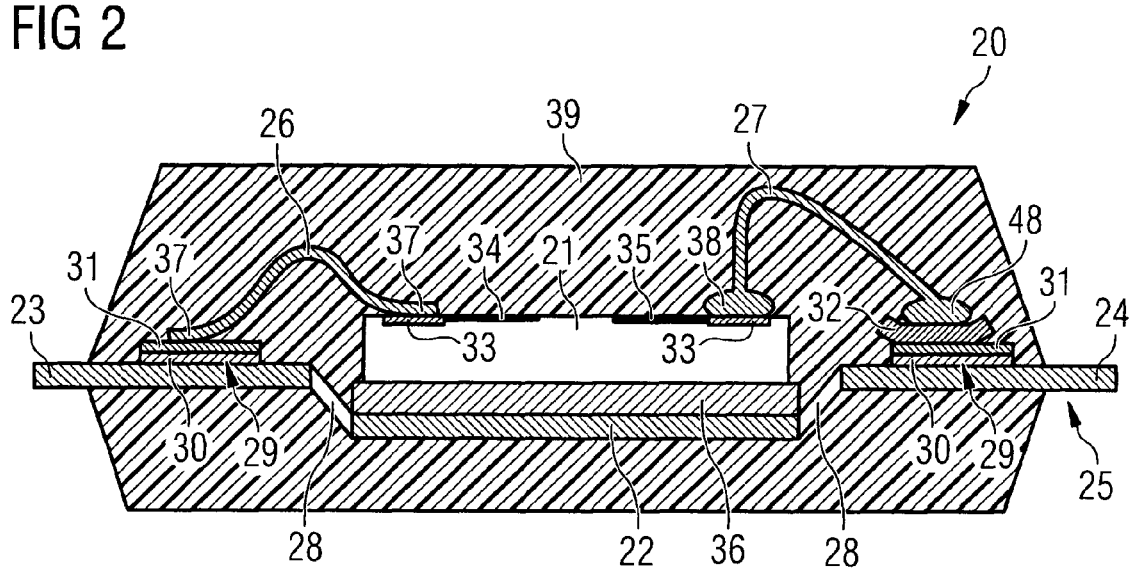
FIG. 2 illustrates an encapsulated mixed wire semiconductor package according to a first embodiment of the invention.

FIG. 2 illustrates an encapsulated mixed wire semiconductor lead frame package 20 which includes a semiconductor chip 21 attached to a recessed die pad 22. The semiconductor chip 21 is electrically connected to a plurality of lead fingers 23, 24 of the lead frame 25 by a first plurality of aluminium bond wires 26 and a second plurality of gold bond wires 27. The diameter of the aluminium bond wires 26 is larger than that of the gold bond wires 27.

The copper lead frame 25 includes a central recessed die pad 22 laterally surrounded by two pluralities of lead fingers 23, 24. The die pad 22 is positioned lower in the package 20 than the lead fingers 23, 24 so that the upper surface of the die pad 22 is positioned slightly lower than the bottom surface of the lead fingers 23, 24 with respect to the top surface of the semiconductor package 20.

The lead frame 25 also includes two die pad leads 28 which extend from the die pad 22 to the outside of the encapsulated package 20. The die pad leads 28 enable the rear surface of the semiconductor chip 21 to be grounded at the same potential as that of the lead frame 25. There are no bond connections between the chip 21 and the die pad leads 28.

The inner portion of each of the lead fingers 23, 24 is located inside the plastic encapsulation 39 of the package 20. Each lead finger 23, 24 includes a landing pad 29 positioned on its upper surface towards the inner end of the inner portion. Each landing pad 29 includes two layers 30, 31 which were deposited by an electroplating technique. Each landing pad 29 includes a layer of nickel 30 located on the surface of the copper lead finger 23, 24 and a layer of nickel phosphorous 31 positioned on the nickel layer 30.

The lead frame 25 according to the invention includes two pluralities of lead fingers 23, 24. They are distinguished in that the second plurality of lead fingers 24 further include an aluminium wedge 32 which is located on the upper surface of the landing pad 29. The first plurality of lead fingers 23 include only a landing pad 29. The aluminium wedge 32 is laterally orientated on the landing pad 29 so that its length lies approximately parallel to the length of the second lead finger 24. In this cross-sectional view, the aluminium wedge 32 has an approximately rectangular cross-section in which the long side is horizontal. The two end portions of the wedge 32 are raised slightly above the surface of the landing pad 29 so that only the central portion of the length of the wedge 32 is in contact with the landing pad 29.

The semiconductor chip 21 includes a plurality of chip contact pads 33 on its upper surface and two pluralities of integrated circuits 34, 35. The back side of the chip 21 is attached by die attach material 36 to the die pad 22 of the lead frame 25. The chip 21 is electrically connected by the first plurality of aluminium bond wires 26 connected between the chip contact pads 33 of the first plurality of integrated circuit devices 34 and the landing pads 29 of the first lead fingers 23. The second plurality of integrated circuit devices 35 are electrically connected by a second plurality of gold bond wires 27 to the aluminium wedges 32 which are located on the landing pads 29 of the second lead fingers 24.

The aluminium bond wires 26 are bonded to the chip contact pads 33 and landing pads 29 of the first lead fingers 23 by wedge-bonds 37 formed using a wedge-bonding technique. Therefore, the end portions of the aluminium wire bonds 26 are positioned approximately parallel to the upper surface of the chip contact pad 33 and landing pad 29 respectively.

The gold wires 27 are bonded to the chip contact pads 33 and the aluminium wedge 32 located on the second lead fingers 24 using a ball bonding technique. A gold bump 48 is formed on the surface of the aluminium wedge 32. A gold wire ball bond 38 is then formed at the chip contact pad 33 and the gold wire 27 extends between the chip contact pad 33 and the gold bump 48 positioned on the aluminium wedge 32 and electrically connects the chip pad 33 with the second lead finger 24. The ball bond 38 formed at the end portion of the gold wire bond 27 where the wire joins the surface of the chip contact pad 33 has an approximately circular or oval cross-section.

The two pluralities of bond wires 26, 27, semiconductor chip 21, die pad 22 and inner portions of the two pluralities of lead fingers 23, 24 are encapsulated by a plastic mould material 39 to form the mixed wire semiconductor lead frame package 20 of the invention. The outer portions of the lead fingers protruding from the plastic encapsulation 39 form the outer contacts of the package 20. The outer contacts enable the package 20 to be mounted on an external substrate such as a printed circuit board which is not illustrated in the diagram.

Figure 3:
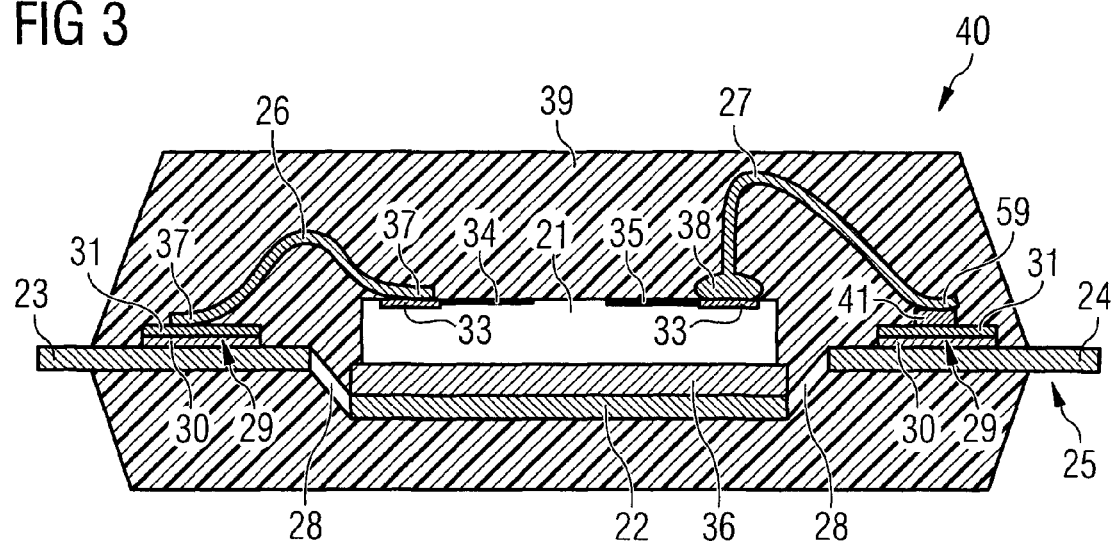
FIG. 3 illustrates an encapsulated mixed wire semiconductor package according to a second embodiment of the invention.

FIG. 3 illustrates a second embodiment of a mixed wire semiconductor lead frame package 40 according to the invention. Parts of the package 40 which are essentially the same as those of the first embodiment 20 illustrated in FIG. 2 have the same reference number and are not necessarily described again.

In this embodiment of the invention, the aluminium wedge 41 is attached to the landing pad 29 of the second lead finger 24 approximately orthogonally with respect to the length of the lead finger 24. Therefore, in the cross-sectional diagram illustrated in FIG. 3 the wedge 41 has an approximately oval cross-section.

In the second embodiment of the invention, the gold wire 27 is bonded to the chip contact pad 33 by a ball-bond 38 and, therefore, has the characteristic ball or oval cross-section. In contrast to the embodiments illustrated in FIG. 2, the gold wire 27 is bonded to the aluminium wedge 41 by a stitch bond 59. The stitch bond 59 has a thin approximately rectangular cross-section.

Figure 4:
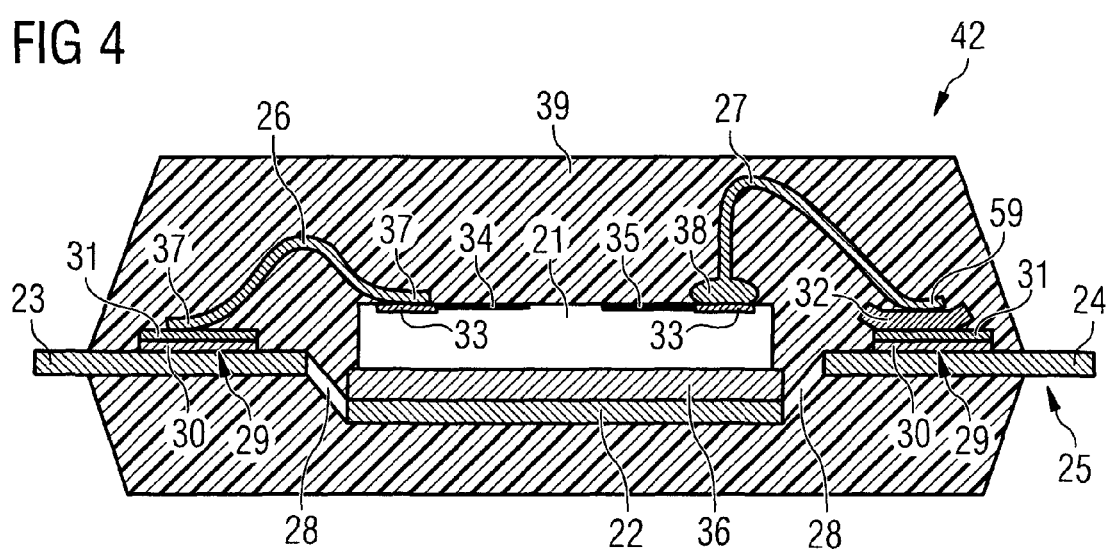
FIG. 4 illustrates an encapsulated mixed wire semiconductor package according to a third embodiment of the invention.

FIG. 4 illustrates a third embodiment of a mixed wire semiconductor lead fame package 42 according to the invention. Parts of the package 42 which are essentially the same as illustrated in the embodiments of the invention of FIGS. 2 and 3 have the same reference number and are not necessarily described again.

In this third embodiment, the aluminium wedge 32 is positioned on the landing pad 29 of the second lead finger 24 as illustrated in the first embodiment of the invention. The wedge 32 is positioned so that its long length is approximately parallel to the long length of the second lead finger 24. In this embodiment of the invention, the gold wire 27 is bonded by a ball bond 38 to the chip contact pad 33 and to the aluminium wedge 32 by a stitch bond 59.

Figure 5:
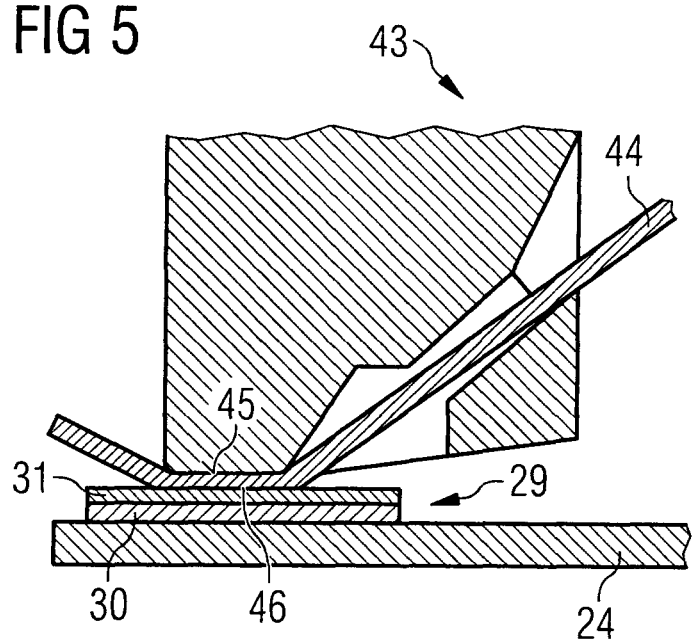
FIG. 5 illustrates a schematic diagram of the first step in the formation of a wedge according to the invention.

FIG. 5 illustrates a schematic diagram of a detail in the first step of the process to produce the aluminium wedge 32 according to the invention. A second lead finger 24 including a landing pad 29 on its upper surface is provided. The landing pad 29 includes a first nickel layer 30 positioned on the copper leadfinger 24 and a nickel phosphorous layer 31 positioned on the nickel layer 30.

A wedge bonding tool 43 encloses the end portion of a spool of aluminium source wire 44. The aluminium source wire 44 is spooled out a desired length and pressed using the pressing surface 45 of the wedge bonding tool 43 into the upper surface of the landing pad 29. The pressed portion 46 of the source wire 44 then undergoes a bonding treatment in which it is subjected to an appropriate ultrasonic energy for an appropriate time in order to bond the pressed portion 46 of the source 44 wire to the landing pad 29.

Figure 6:
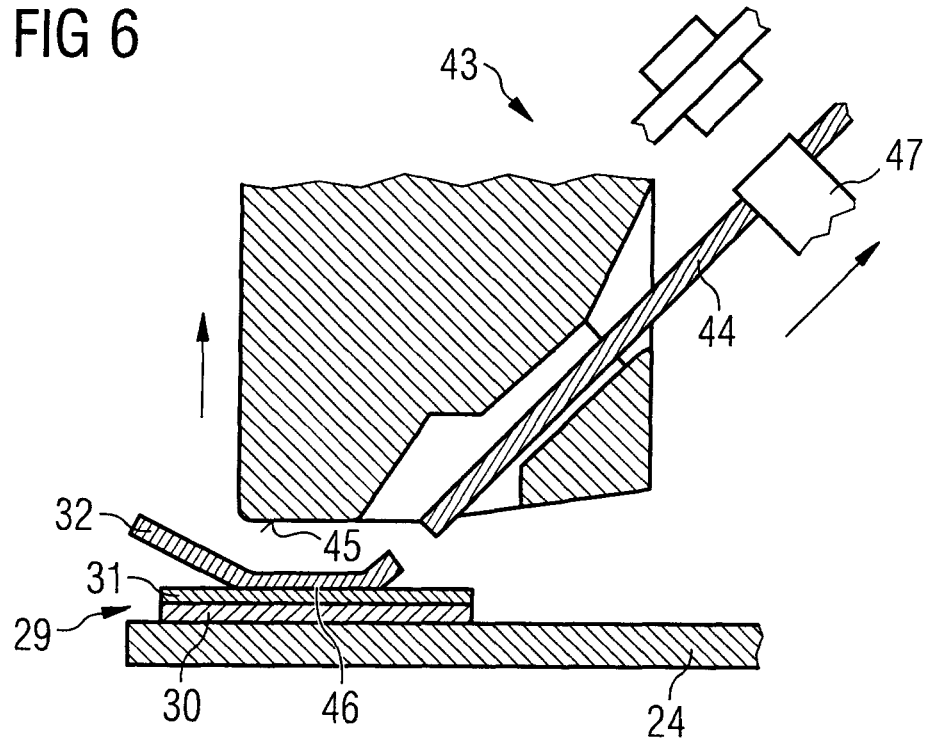
FIG. 6 illustrates a schematic diagram of the second step of in the formation of a wedge according to the invention.

FIG. 6 illustrates a schematic diagram of the second step in the process to form the aluminium wedge 32 according to the invention. After the bonding process is complete, the wedge bonding tool 43 is raised upwards a small distance with respect to the surface of the lead finger 24 as indicated by the arrow. The wire clamp 47 of the wedge bonding tool 43 then closes onto the aluminium source wire 44 and the bonding tool 43 is moved sideways and upwards with respect to the landing pad 29, as illustrated by the arrow, in order to break the source wire 43 at a position close to the pressed portion 46 and the landing pad 29. In this way an aluminium wedge 32 is formed on the landing pad 29 of the second lead finger 24.

Figure 7:
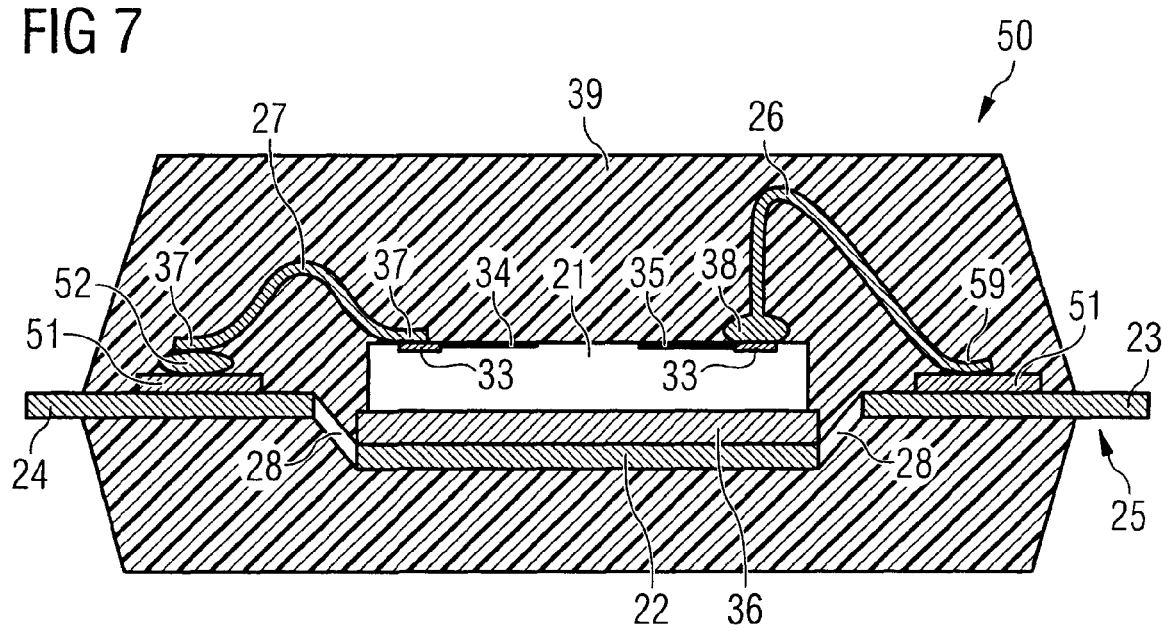
FIG. 7 illustrates an encapsulated mixed wire semiconductor package according to a fourth embodiment of the invention.

FIG. 7 illustrates a fourth embodiment of a mixed wire semiconductor lead frame package 50 according to the invention. Parts of the package 50 which are essentially the same as those of the first embodiment illustrated in FIG. 2 are indicated by the same reference number and are not necessarily described again.

In this embodiment of the invention, the first lead fingers 23 and a second lead fingers 24 of the copper lead frame 25 include a landing pad 51 positioned towards the end of the inner portion. In contrast to the previous embodiments of the invention, the landing pad 51 includes silver.

In this fourth embodiment of the invention, a gold bump 52 is positioned on the silver landing pad 51 of the second plurality of lead fingers 24.

The aluminium bond wires 27 are bonded with a wedge bond 37 to the chip contact pads 33 and to the gold bump 52 positioned on the silver landing pad 51 of the second lead finger 24. The gold wires 26 are bonded to the chip contact pads by a ball bond 38 and to the silver landing pad 51 positioned on the inner portion of the first lead finger 23 of the lead frame 25 by a stitch bond 59.

FIG. 8 illustrates a first multi-chip module 53 including two semiconductor chips 54 and 55 according to the invention. Parts of the multi-chip module 53 which are similar to those of the previous embodiments are indicated by the same reference number and are not necessarily described again.

The multi-chip module 53 includes a copper lead fame 25 including a recessed die pad 22 laterally surrounded by a plurality of first lead fingers 23 and a plurality of second lead fingers 24. A landing pad 29 is positioned towards the end of the inner portion of the first plurality 23 and second plurality 24 of lead fingers and includes a Ni layer 30 positioned on the first 23 and second 24 leadfingers and a NiP layer 31 attached to the nickel layer The second plurality of lead fingers 24 further include an aluminium wedge 32 which is positioned on the nickel phosphorous layer 31 of the landing pad 29.

The first 54 and the second 55 semiconductor chip are mounted laterally adjacent to each other on the die pad 22 by die attach material 36. Each of the semiconductor chips 54 and 55 includes a plurality of first integrated circuits 34, second integrated circuits 35 and chip contact pads 33 on its upper active surface. The first semiconductor chip 54 is electrically connected by an aluminium bond wire 26 to the landing pads 29 positioned on the first lead finger 23.

The first semiconductor chip 54 is also electrically connected to the second semiconductor chip 55 by a gold wire 56 which contacts a chip contact pad 33 of semiconductor chip 54 with a chip contact pad 33 of semiconductor chip 55. The gold wire 56 is connected to the chip contact pads 33 of the semiconductor chip 55 by a ball bond 38 and to the contact pad 33 of the semiconductor chip 54 by a stitch bond 59 on a gold bump 48.

The second semiconductor chip 55 is electrically connected to the second lead finger 24 by a gold wire 27. The gold wire 27 is connected to the chip contact pad 33 by a ball bond 38 and to the aluminium wedge 32 positioned on the landing pad 29 of the second lead finger 24 by a stitch bond 59. The diameter of the aluminium wires 26 is larger than that of the gold wires 27 which connect the second semiconductor chip to the leadfingers 24 and the gold wires 56 which connect the first 54 and second 55 semiconductor chip.

The first 54 and second 55 semiconductor chips, the die pad 22, bond wires 26, 27, 56 and the inner portions, including the landing pads 29, of the first 23 and second 24 pluralities of lead fingers are encapsulated in a plastic mold material 39. The outer portions of the first 23 and second 24 pluralities of lead fingers extend outside of the semiconductor package 53 and provide the external electrical connection for the package. The outer portions of the lead fingers 23 and 24 enable the package 53 to be mounted on and electrically connected to an external substrate such as a printed circuit board (which is not illustrated in the diagram).

FIG. 9 illustrates a second multi-chip module 57 including two semiconductor chips 54 and 55 according to the invention. Parts of the second multi-chip module 57 which are similar to those of the previous embodiments are indicated by the same reference number and are not necessarily described again.

The second multi-chip module 57 further includes a chip aluminium wedge 58 positioned on a chip contact pad 33 of the first semiconductor chip 54. A gold wire 56 connects the first 54 and second 55 semiconductor chip of the second multi-chip module 57. The gold wire 56 is bonded to the chip aluminium wedge 58 on the first semiconductor chip 54 by a stitch bond 59 and to a chip contact pad 33 of the second semiconductor chip 55 by a ball bond 38.

The second multi-chip module 57 also includes an aluminium wedge 32 positioned on the second leadfinger 24 as illustrated in the multi-chip embodiment of FIG. 8.

Figure 10:
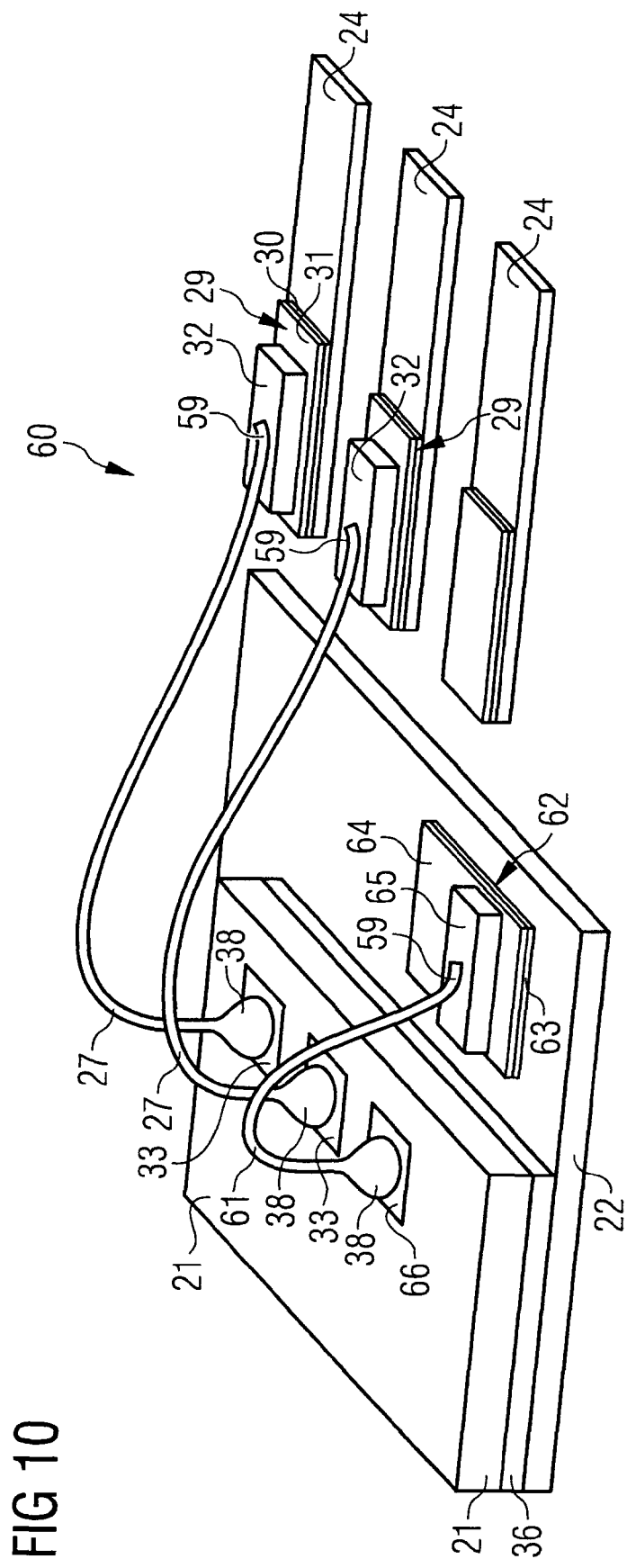
FIG. 10 illustrates a schematic perspective view of a section of a mixed wire semiconductor package including grounding connections according to one embodiment of the invention.

FIG. 10 illustrates a schematic perspective view of a section of a mixed wire semiconductor package 60 which includes grounding connections 61 between the active surface of the chip 21 and the die pad 22. The package encapsulation is not illustrated for clarity in this figure.

FIG. 10 illustrates a section of a semiconductor chip 21 including chip contact pads 33 on the upper active surface. The chip 21 is mounted by die attach material 36 in approximately the lateral centre of the die pad 22. The die pad 22 is laterally larger than the chip 21. The chip 21 and die pad 22 are laterally surrounded by a plurality of first and second leadfingers 23, 24 of which the inner portion of three second leadfingers 24 are illustrated in the figure.

Similarly to the embodiments of FIGS. 2 to 4, the second leadfingers 24 include a landing pad 29, including a layer of Ni 30 and a layer of NiP 31, and an aluminium wedge 32 positioned on the landing pad 29. The aluminium wedges 32 are positioned approximately parallel to the length of the leadfingers 24. The integrated circuits 35 on the active surface of the chip 21 are electrically connected to the second leadfingers 24 by gold bond wires 27 which extend between a chip contact pad 33 and an aluminium wedge 32. The gold wires 27 are connected to the chip pad 33 by a ball bond 38 and to the aluminium wedge 32 by a stitch bond 59.

In this embodiment of the invention, the die pad 22 includes grounding pads 62 positioned on the upper surface of the die pad 22 of which one ground pad 62 is illustrated in the Figure. The grounding pads 62 are laterally positioned towards the outer edge the die pad 22 and are, therefore, positioned between the semiconductor chip 21 and the lead fingers. The grounding pad 62 also includes two electroplated layers and includes a layer of Ni 63 positioned on the surface of the copper die pad 22 and a layer 64 including NiP positioned on the nickel layer 63.

A grounding aluminium wedge 65 is positioned on the grounding pad 62. The chip 21 is grounded to the die pad 22 by a gold grounding wire 61 which extends between a contact pad 66 on the upper surface of the chip 21 and the grounding aluminium wedge 65 on the grounding pad 62. The grounding gold wire 61 is connected to the contact pad 66 by a ball bond 38 and to the grounding aluminium wedge 62 by a stitch bond 59.

What is claimed is:

1. A semiconductor package comprising:
   a lead frame comprising a die pad, a plurality of first leadfingers and a plurality of second leadfingers, each including a landing pad on its inner portion;
   a semiconductor chip including integrated circuits and chip contact pads on its upper active surface, the semiconductor chip being attached to the die pad by its rear passive surface;
   a plurality of first bond wires comprising a first electrically conductive material, each extending between a chip contact pad and a landing pad of the plurality of first leadfingers;
   a plurality of second bond wires comprising a second electrically conductive material, each extending between a chip contact pad and a second leadfinger;
   a plastic mould mass encapsulating the semiconductor chip, the pluralities of first and second bond wires and inner portions of the pluralities of first leadfingers and second leadfingers; and
   a plurality of first electrically conducting means, a first electrically conducting means being attached to the landing pad of each of the plurality of second leadfingers, and a second bond wire being attached to the first electrically conducting means, wherein the plurality of first conducting means comprise a material different from that of the plurality of second bond wires and of the landing pads of the plurality of second leadfingers.

2. The semiconductor package of claim 1, wherein the first electrically conducting means has an approximately rectangular longitudinal cross-section and is positioned on the landing pad with its long side approximately orthogonal to the length of the second leadfinger.

3. A semiconductor package comprising:
   a lead frame comprising a die pad, a plurality of first leadfingers and a plurality of second leadfingers, each including a landing pad on its inner portion;
   a semiconductor chip including integrated circuits and chip contact pads on its upper active surface, the semiconductor chip being attached to the die pad by its rear passive surface;
   a plurality of first bond wires comprising a first electrically conductive material, each extending between a chip contact pad and a landing pad of the plurality of first leadfingers;
   a plurality of second bond wires comprising a second electrically conductive material, each extending between a chip contact pad and a second leadfinger;
   a plastic mould mass encapsulating the semiconductor chip, the pluralities of first and second bond wires and inner portions of the pluralities of first leadfingers and second leadfingers; and
   a plurality of first electrically conducting means, a first electrically conducting means being attached to the landing pad of each of the plurality of second leadfingers, and a second bond wire being attached to the first electrically conducting means, wherein under wire-bonding conditions:
   the material of the first bond wire and the material of the landing pad form a eutectic;
   the material of the first electrically conducting means and the material of the landing pad form a eutectic;
   the material of the second bond wire and the material of the landing pad form no eutectic; and
   the material of the second bond wire and the material of the first electrically conducting means form a eutectic.

4. A semiconductor package comprising:
   a lead frame comprising a die pad, a plurality of first leadfingers and a plurality of second leadfingers, each including a landing pad on its inner portion;
   a semiconductor chip including integrated circuits and chip contact pads on its upper active surface, the semiconductor chip being attached to the die pad by its rear passive surface;
   a plurality of first bond wires comprising a first electrically conductive material, each extending between a chip contact pad and a landing pad of the plurality of first leadfingers;
   a plurality of second bond wires comprising a second electrically conductive material, each extending between a chip contact pad and a second leadfinger;
   a plastic mould mass encapsulating the semiconductor chip, the pluralities of first and second bond wires and inner portions of the pluralities of first leadfingers and second leadfingers; and
   a plurality of first electrically conducting means, a first electrically conducting means being attached to the landing pad of each of the plurality of second leadfingers, and a second bond wire being attached to the first electrically conducting means, wherein:
   the lead frame comprises copper;
   the landing pads comprise a layer of nickel positioned on the surface of the first and second leadfingers and a layer of nickel phosphorous positioned on the layer of nickel;
   the plurality of first bond wires and the plurality of first electrically conducting means comprise aluminium or an aluminium alloy; and
   the plurality of second bond wires comprise gold or a gold alloy.

5. The semiconductor package of claim 4, wherein the lead frame includes a recessed die pad.

6. The semiconductor package of claim 4, wherein the plurality of first electrically conductive means comprises a plurality of electrically conductive bumps or electrically conductive wedges or electrically conductive balls.

7. The semiconductor package of claim 4, wherein the first electrically conducting means has an approximately rectangular longitudinal cross-section and is positioned on the landing pad with its long side of approximately parallel to the length of the second leadfinger.

8. The semiconductor package of claim 4, wherein the plurality of first bond wires is attached to the landing pads of the first leadfingers with a ball bond, a bump or wedge bond and the plurality of second bond wires is attached to the first electrically conducting means on the second leadfingers with a ball-bond, a bump or a stitch bond.

9. The semiconductor package of claim 4, wherein the plurality of second bond wires and the plurality of first electrically conducting means comprise a different material.

10. The semiconductor package of claim 4, wherein the semiconductor package includes at least one second electrically conducting means attached to at least one chip contact pad.

11. The semiconductor package of claim 4, wherein at least one second electrically conducting means is electrically connected to the chip pad and a bond wire.

12. The semiconductor package of claim 11, wherein the at least one second electrically conductive means comprises an electrically conductive bump or electrically conductive wedge or electrically conductive ball.

13. The semiconductor package of claim 12, wherein the at least one second electrically conductive means comprises essentially the same material as the first electrically conductive means.

14. The semiconductor package of claim 4, wherein the semiconductor package further includes a plurality of grounding pads positioned on the die pad.

15. The semiconductor package of claim 14, wherein the plurality of grounding electrically conducting means is positioned on the grounding pads, and a grounding wire extending between a chip contact pad and the grounding electrically conductive means.

16. The semiconductor package of claim 15, wherein the plurality of grounding electrically conductive means comprises a plurality of electrically conductive bumps or electrically conductive wedges or electrically conductive balls.

17. The semiconductor package of claim 15, wherein the plurality of grounding bond wires is attached to the grounding electrically conducting means on the die pad with a ball-bond, a bump or a stitch bond.

18. The semiconductor package of claim 15, wherein under wire-bonding conditions:
the material of the first bond wire and the material of the landing pad form a eutectic, the material of the first electrically conducting means forming a eutectic with the material of the landing pad, the material of the grounding electrically conductive means and the material of the grounding pad forming a eutectic;
the material of the second bond wire and the material of the landing pad form no eutectic, and the material of the second bond wire and the material of the first electrically conducting means forming a eutectic, and the material of the grounding wire and the material of the grounding electrically conductive means form a eutectic.

19. The semiconductor package of claim 14, wherein:
the lead frame comprises copper;
the grounding pads comprise a layer of nickel positioned on the surface of the die pad and a layer of nickel phosphorous positioned on the layer of nickel;
the plurality of first bond wires, the electrically conducting means and the grounding electrically conductive means comprise aluminium or an aluminium alloy; and
the plurality of second bond wires and the plurality of grounding wires comprise gold or a gold alloy.

20. A semiconductor package comprising:
a lead frame comprising a die pad, a plurality of first leadfingers and a plurality of second leadfingers, each including a landing pad on its inner portion;
a semiconductor chip including integrated circuits and chip contact pads on its upper active surface, the semiconductor chip being attached to the die pad by its rear passive surface;
a plurality of first bond wires comprising a first electrically conductive material, each extending between a chip contact pad and a landing pad of the plurality of first leadfingers;
a plurality of second bond wires comprising a second electrically conductive material, each extending between a chip contact pad and a second leadfinger;
a plastic mould mass encapsulating the semiconductor chip, the pluralities of first and second bond wires and inner portions of the pluralities of first leadfingers and second leadfingers; and
a plurality of first electrically conducting means, a first electrically conducting means being attached to the landing pad of each of the plurality of second leadfingers, and a second bond wire being attached to the first electrically conducting means, further comprising:
the lead frame comprises copper, the landing pads comprise silver, the plurality of second bond wires comprise gold or gold alloy; and
the plurality of first bond wires and the plurality of first electrically conducting means comprise aluminum or an aluminum alloy.

21. The semiconductor package of claim 20, wherein the plurality of first bond wires and the plurality of first electrically conducting means comprise essentially the same material.

* * * * *